(12) United States Patent
Oozeki et al.

(10) Patent No.: US 10,170,885 B2
(45) Date of Patent: Jan. 1, 2019

(54) CURRENT CONTROL DEVICE AND LASER DEVICE

(71) Applicant: MITUTOYO CORPORATION, Kanagawa (JP)

(72) Inventors: Hidekazu Oozeki, Ibaraki (JP); Toshiaki Matsuura, Ibaraki (JP)

(73) Assignee: MITUTOYO CORPORATION, Kanagawa (JP)

( * ) Notice: Subject to any disclaimer, the term of this patent is extended or adjusted under 35 U.S.C. 154(b) by 0 days.

(21) Appl. No.: 15/625,241

(22) Filed: Jun. 16, 2017

(65) Prior Publication Data
US 2017/0373467 A1  Dec. 28, 2017

(30) Foreign Application Priority Data

Jun. 27, 2016  (JP) ................................. 2016-126370

(51) Int. Cl.
| | |
|---|---|
| *H01S 3/13* | (2006.01) |
| *H01S 3/137* | (2006.01) |
| *H01S 5/042* | (2006.01) |
| *H01S 5/06* | (2006.01) |
| *H01S 5/0683* | (2006.01) |
| *H01S 3/139* | (2006.01) |
| *H01S 3/131* | (2006.01) |
| *H01S 3/00* | (2006.01) |

(Continued)

(52) U.S. Cl.
CPC ............ *H01S 3/137* (2013.01); *H01S 3/0078* (2013.01); *H01S 3/109* (2013.01); *H01S 3/1312* (2013.01); *H01S 3/1317* (2013.01); *H01S 3/1392* (2013.01); *H01S 5/042* (2013.01); *H01S 5/0604* (2013.01); *H01S 5/0612* (2013.01); *H01S 5/0683* (2013.01); *H01S 3/0092* (2013.01); *H01S 3/1611* (2013.01); *H01S 3/1673* (2013.01)

(58) Field of Classification Search
CPC ...... H01S 3/137; H01S 3/1392; H01S 3/1312; H01S 3/1317; H01S 3/1611; H01S 3/1673; H01S 3/0092; H01S 3/0078; H01S 3/109; H01S 5/041; H01S 5/0604; H01S 5/0612; H01S 5/0683
See application file for complete search history.

(56) References Cited

U.S. PATENT DOCUMENTS 5,226,051 A * 7/1993 Chan ....................... H01S 3/115
                                                    372/10
2005/0237600 A1* 10/2005 Isshiki ................... H01S 3/1312
                                                    359/334

(Continued)

FOREIGN PATENT DOCUMENTS

JP          2012-134371 A       7/2012

*Primary Examiner* — Kinam Park
(74) *Attorney, Agent, or Firm* — Greenblum & Bernstein, P.L.C.

(57) ABSTRACT

A current control device supplies a current to a semiconductor laser in order to output laser light to the semiconductor laser, and includes a current commander and a supplier. The current commander outputs a command value corresponding to a current value by increasing the command value with a lapse of time until reaching a target command value corresponding to a current value for outputting the laser light with a predetermined strength. The supplier supplies a current with a size corresponding to the command value output by the current commander to the semiconductor laser.

11 Claims, 7 Drawing Sheets

(51) Int. Cl.
*H01S 3/109* (2006.01)
*H01S 3/16* (2006.01)

(56) References Cited

U.S. PATENT DOCUMENTS

| | | | |
|---|---|---|---|
| 2006/0159140 A1* | 7/2006 | Machida | H01S 3/0602 |
| | | | 372/33 |
| 2009/0185587 A1* | 7/2009 | Koshimae | H01S 3/1312 |
| | | | 372/22 |
| 2014/0044226 A1* | 2/2014 | Campbell | G21B 1/23 |
| | | | 376/103 |
| 2014/0056320 A1* | 2/2014 | Maryashin | H01S 3/11 |
| | | | 372/25 |
| 2017/0153319 A1* | 6/2017 | Villeneuve | G01S 7/4804 |

* cited by examiner

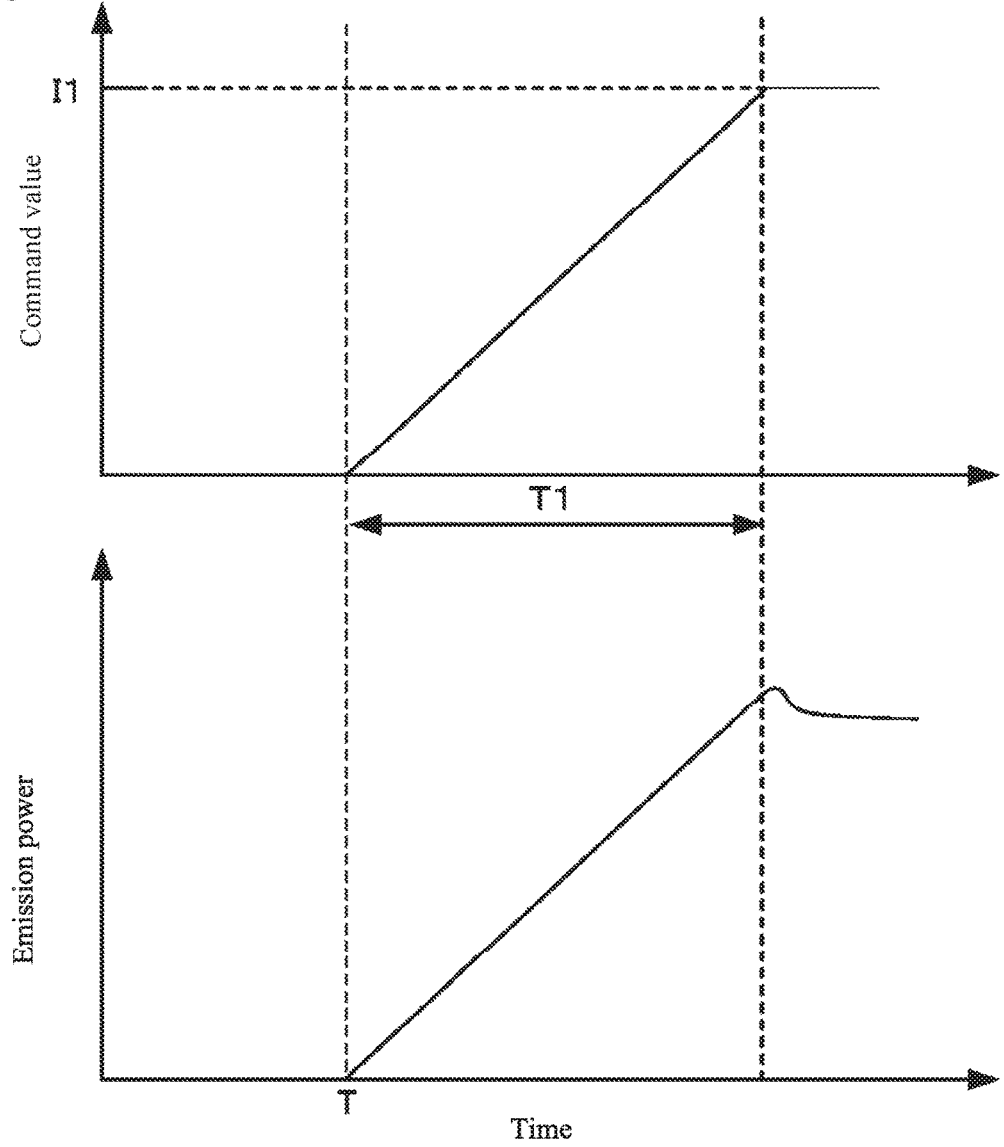

US 10,170,885 B2

CURRENT CONTROL DEVICE AND LASER DEVICE

CROSS-REFERENCE TO RELATED APPLICATIONS

The present application claims priority under 35 U.S.C. § 119 of Japanese Application No. 2016-126370, filed on Jun. 27, 2016, the disclosure of which is expressly incorporated by reference herein in its entirety.

BACKGROUND OF THE INVENTION

1. Field of the Invention

The present invention relates to a current control device which supplies a current to a semiconductor laser and a laser device.

2. Description of Related Art

Conventionally, laser devices are known in which a resonator length is changed based on a saturated absorption line included in a light output signal, which is obtained by firing laser light at an absorption cell, and an oscillation frequency of the laser light is stabilized to a specific saturated absorption line (see, e.g., Japanese Patent Laid-open Publication No. 2012-134371).

In the conventional laser devices, arrangement of each optical element provided inside a resonator is adjusted to obtain a desired wavelength, and final emission power of the laser light is adjusted by an optical system connected to a later stage of the resonator.

In a transient state immediately after starting a semiconductor laser, the laser light emitted from the semiconductor laser and the laser light reflecting inside the resonator strike a KTP crystal, which is provided inside the resonator, and converts the laser light wavelength to a predetermined wavelength. Therefore, heat of the laser light is externally disturbed and temperature of the KTP crystal is changed. Because a refractive index of the KTP crystal changes based on the temperature, conversion efficiency of the laser light in the predetermined wavelength is changed according to the change in temperature. Therefore, in the transient state immediately after starting the semiconductor laser, compared to a state where a sufficient time is passed after starting, the emission power of the laser light emitted from the resonator is increased. As a result, the emission power of the laser light emitted from the laser device may also be increased.

FIG. 7 illustrates a relationship between a current command value input immediately after starting the semiconductor laser and the emission power of the laser light in the conventional laser device. As shown in FIG. 7, when the command value in a rectangular wave shape is given, impulse-like overshooting occurs to the emission power in the laser light and the emission power is rapidly increased.

Based on the safety standard IEC60825-1, laser products are classified by the emission power and the like, and safety measures are required to be taken according to the respective class. In the laser product having a characteristic shown in FIG. 7, the emission power is approximately 2.5 mW and corresponds to a class 3R when the temperature of the KTP crystal is stable after starting. However, in the transient state immediately after starting, the emission power is approximately 6.6 mW and corresponds to a class 3B. The class 3B requires stricter safety measures compared to the class 3R, and thus a cost of the product may be increased. In addition, the class 3B also increases a burden on a user since a safety officer needs to be present during use. Given this, in the transient state immediately after starting, overshooting of the emission power of the laser device is required to be suppressed within a range of the class 3R.

SUMMARY OF THE INVENTION

In view of these circumstances, the present invention provides a current control device which is capable of suppressing overshooting of emission power of a laser device in a transient state immediately after starting. Further, the present invention provides a laser device which is capable of suppressing overshooting of the emission power in the transient state immediately after starting.

According to one aspect of the present invention, the current control device supplies a current to a semiconductor laser in order to output laser light to the semiconductor laser. The current control device includes a current commander and a supplier. The current commander outputs a command value corresponding to a current value by increasing the command value with a lapse of time until reaching a target command value which corresponds to the current value in order to output the laser light with a predetermined strength. The supplier supplies a current with a size corresponding to the command value output by the current commander to the semiconductor laser.

The current commander may increase the command value in steps. The current commander may increase the command value continuously. The current commander may decrease an increment of the command value with a lapse of time. The current commander may increase the increment of the command value with a lapse of time. The current control device further includes a detector detecting the current value and the current commander may change the increment of the command value based on the detected current value.

According to another aspect of the present invention, a laser device includes the current control device; the semiconductor laser, a nonlinear optical crystal which converts the laser light output from the semiconductor laser into the laser light having a different frequency from the frequency of the laser light; and a temperature control device controlling temperature of the nonlinear optical crystal. The current commander outputs the increased command value with a lapse of time in a duration of time longer than the time required by the temperature control device to control the temperature of the linear optical crystal.

According to the present invention, overshooting of the emission power of the laser device can be suppressed in the transient state immediately after starting.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein:

FIG. 5 illustrates a relationship between the current command value and the emission power of the laser light when the current command value is increased continuously;

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

Configuration of Laser Device 100

Figure 1:
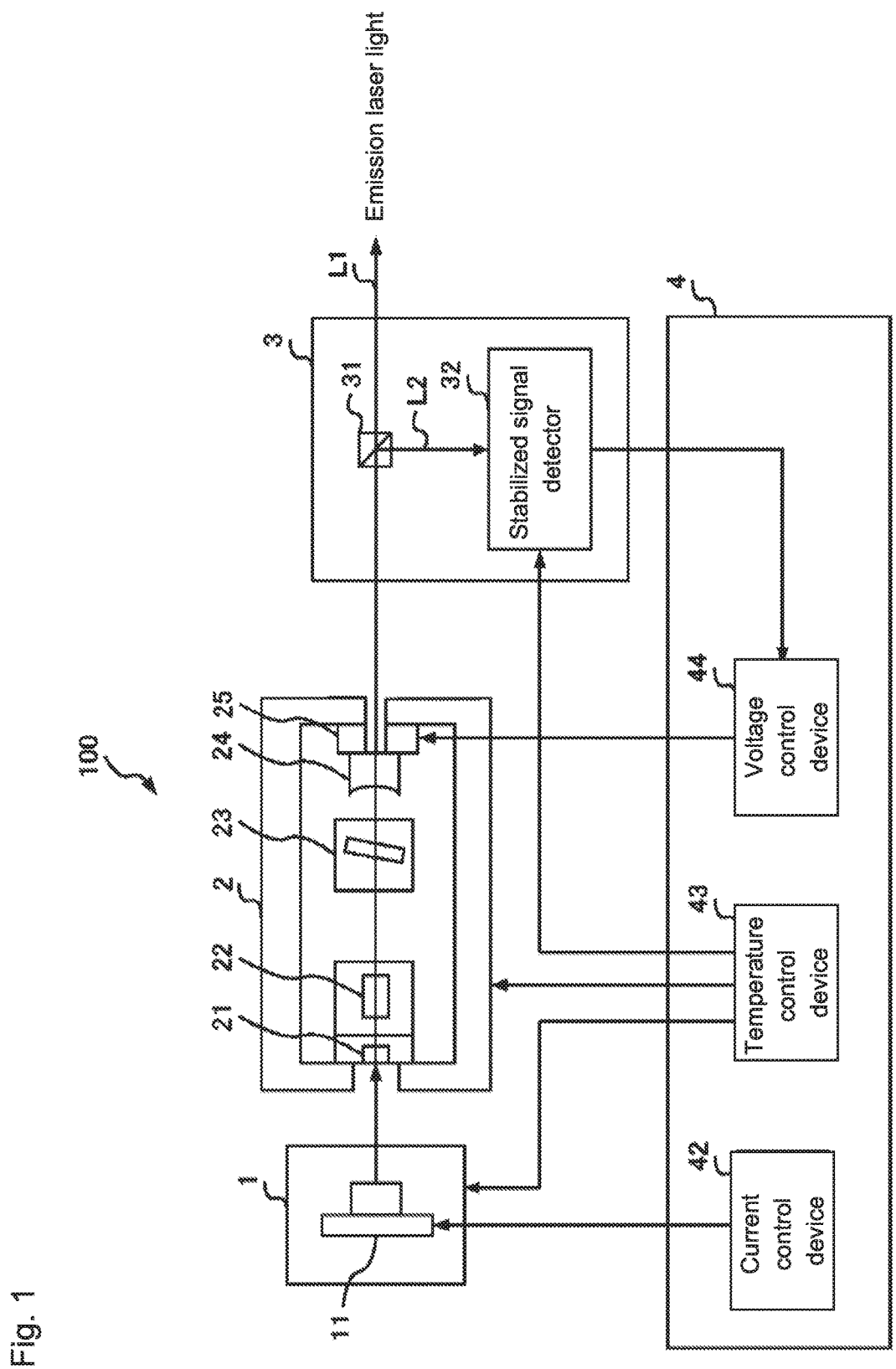
FIG. 1 illustrates a configuration of a laser device.

FIG. 1 illustrates a configuration of a laser device 100 according to the present embodiment. The laser device 100 is a 532 nm iodine stabilized laser. The laser device 100 is a solid laser being in a 532 nm region in continuous-wave oscillation using a Nd:YV04 crystal (as a gain medium) excited by a semiconductor laser, and is used as a standard for length. The laser device 100 uses a spectroscopic technique for iodine molecule absorption lines, and a high degree of frequency stability can be obtained by controlling an oscillation frequency centered on a saturated absorption line of the iodine molecule.

The laser device 100 includes an excitation semiconductor laser 1, a laser resonator housing 2, an iodine stabilized optical system 3, and a controller 4. The excitation semiconductor laser 1 has a semiconductor laser 11 and strikes excitation laser light in a 808 nm region output from the semiconductor laser 11 at the laser resonator housing 2.

The laser resonator housing 2 includes an Nd:YV04 crystal 21, a KTP crystal 22, an etalon 23, a reflecting mirror 24, and a piezo element 25. The excitation laser light fired from the excitation semiconductor laser 1 strikes the Nd:YV04 crystal 21 and the Nd:YV04 crystal 21 outputs 1064 nm-wavelength laser light. A coating is applied on an end face of the Nd:YV04 crystal 21 to reflect the 1064 nm light. The 1064 nm laser light output by the Nd:YV04 crystal 21 is converted into a 532 nm-wavelength laser light which is a second harmonic wave in the KTP crystal 22 (nonlinear optical crystal).

The laser light output by the KTP crystal 22 strikes the reflecting mirror 24 via the etalon 23 which is a wavelength filter. The reflecting mirror 24 reflects the laser light and configures a laser resonator with the Nd:YV04 crystal 21 by reflecting the laser light being struck.

The piezo element 25 is a piezoelectric element displacing a position of the reflecting mirror 24 by distortion occurred by an application of voltage from the controller 4. By applying sine wave-shaped AC voltage to the piezo element 25, a distance between the Nd:YV04 crystal 21 and the reflecting mirror 24 is displaced in a cycle synchronized with the AC voltage, and therefore, modulated laser light is output by conducting a frequency modulation to the laser light.

The iodine stabilized optical system 3 includes a beam splitter 31 and a stabilized signal detector 32. The beam splitter 31 separates the laser light input from the laser resonator housing 2 into emission laser light L1 and wavelength control laser light L2. The wavelength control laser light L2 is entered into the stabilized signal detector 32. The stabilized signal detector 32 includes an iodine cell which is an absorption cell, and enters a light output signal based on the wavelength control laser light L2 that has passed through the iodine cell into the controller 4.

The controller 4 includes a current control device (controller or current controller) 42, a temperature control device (temperature controller) 43, and a voltage control device 44. The temperature control device 43, based on the temperature detected by a temperature sensor which is provided adjacent to the semiconductor laser 11, the KTP crystal 22, the etalon 23, and the stabilized signal detector 32 to be controlled, activates a temperature changing device (a Peltier element or the like) provided to a fixated holder of each control subject and controls each control subject to reach a target temperature.

The voltage control device 44 stabilizes the laser wavelength by controlling the voltage applied to the piezo element 25 and the resonator length (distance between the Nd:YV04 crystal 21 and the reflecting mirror 24). Specifically, the voltage control device 44 detects a signal component based on the oscillation frequency from the light output signal output from the stabilized signal detector 32 by a lock-in amplifier, for example, and controls the amount of displacement of the piezo element 25 attached to the reflecting mirror 24 by controlling the resonator length by changing the position of the reflecting mirror 24.

Figure 2:
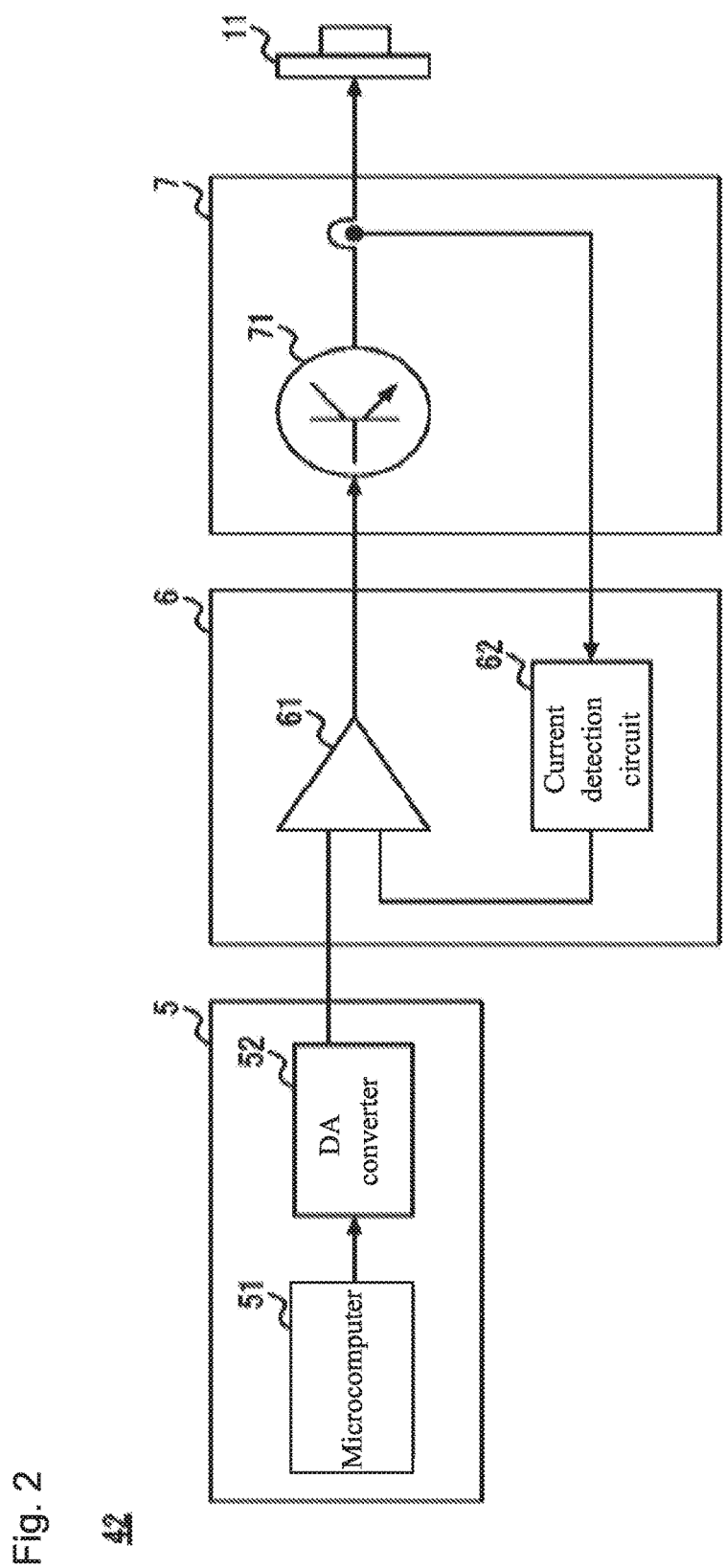
FIG. 2 illustrates a configuration of a current control device.

The current control device 42 supplies a laser current to the semiconductor laser 11 to cause the semiconductor 11 to output the laser light. FIG. 2 illustrates a configuration of the current control device 42. The current control device 42 includes a current commander (processor or current processor) 5, a current controller 6, and a current driver 7.

The current commander 5 includes a microcomputer 51 and a DA converter 52. The microcomputer 51 outputs the current command value which is a digital signal to the DA converter 52. The DA converter 52 converts the current command value input by the microcomputer 51 into a control command value which is an analogue signal. The DA converter 52 applies control command voltage (the voltage value converted from the control command value) to the current controller 6. In the following description, the control command value is simply referred to as a command value.

The current controller 6 and the current driver 7 serve as a current supplier (circuit or supply circuit) and supply a current with a size corresponding to the command value output by the current commander 5 to the semiconductor laser 11. The current controller 6 includes an operational amplifier 61 and a current detection circuit 62. The current detection circuit 62 detects the current value of the laser current supplied to the semiconductor laser 11 and enters laser current detection voltage corresponding to the current value to the operational amplifier 61. The operational amplifier 61 controls the laser current such that the control command voltage and the laser current detection voltage be matched.

The current driver 7 is a transistor 71, for example, and supplies the semiconductor laser 11 with the control current output from the operational amplifier 61 as a base current, and the current value of the base current is amplified by a predetermined amplification rate as the laser current.

In the present embodiment, the current commander 5 of the current control device 42 outputs the command value corresponding to the current value of the laser current by increasing the command value with a lapse of time, until the semiconductor laser 11 reaches a target command value corresponding to the current value of the laser current to output the laser light with a predetermined strength. Specifically, the current commander 5 outputs the command value gradually increasing (in steps).

Figure 3:
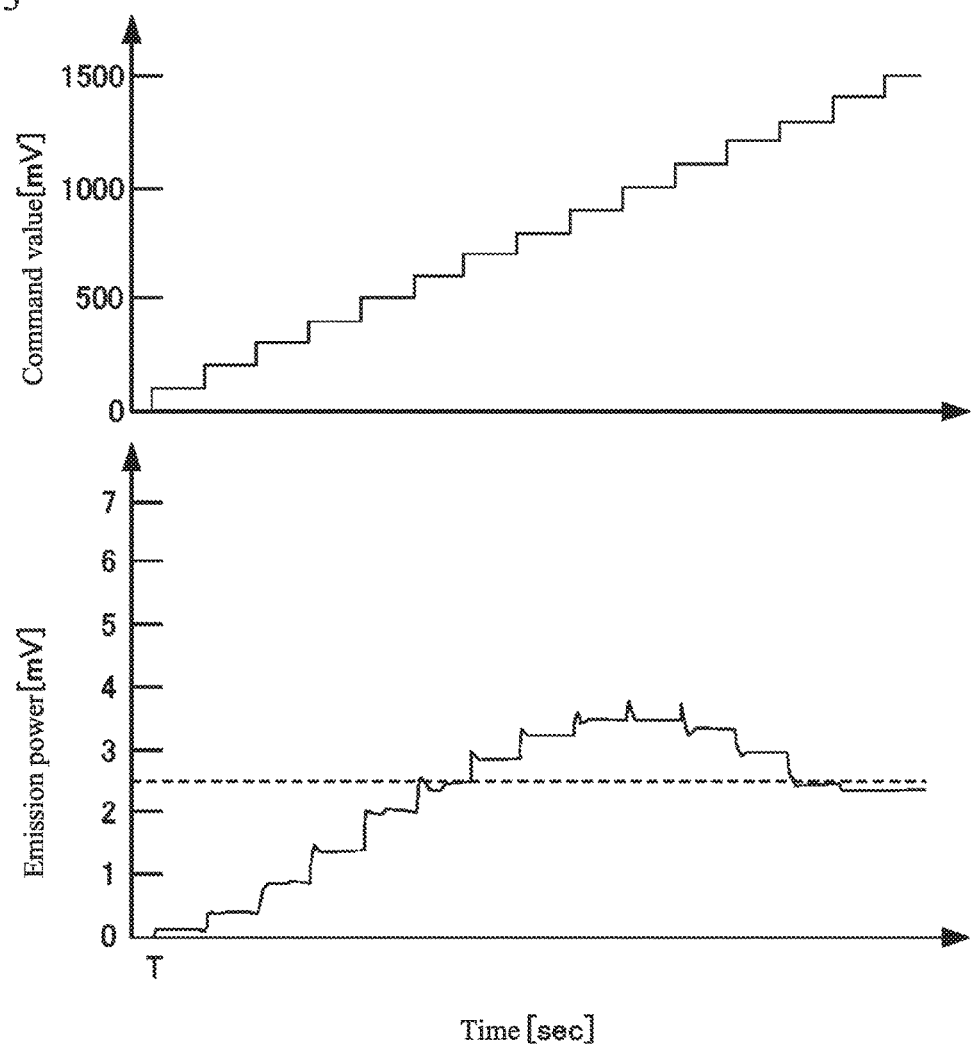
FIG. 3 illustrates a relationship between a current command value and emission power of laser light when the current command value is increased in steps.

FIG. 3 illustrates a relationship between the command value and the emission power of the laser light, when the command value output from the current commander 5 is increased in steps. Specifically, FIG. 3 illustrates a relationship between the command value and the emission power of the laser light in a case where the output of the command value is started at a time point "T" and the command value is incrementally increased by 100 mV as time elapses.

In the example shown in FIG. 3, by increasing the command value in steps, it can be confirmed that overshooting immediately after increasing the command value can be suppressed to a small degree and the maximum value of the emission power is suppressed to about 4 mW. In this example, since a range of the emission power regulated in the class 3R is at 5 mW or below, the range of the emission power of the laser device 100 is suppressed within the range of the emission power regulated by the class 3R.

When the command value is increased, the laser light output from the semiconductor laser 11 and the laser light reflecting inside the resonator housing 2 strike the KTP crystal 22. Therefore, heat of the laser light is externally disturbed and temperature of the KTP crystal 22 is changed. The KTP crystal 22, due to the refractive index changing based on the temperature, changes the conversion efficiency to the 532 nm laser light. As a result, the emission power of the laser light output from the laser device 100 is also increased and overshooting occurs. The time to calm down overshooting corresponds to the time required until the temperature of the KTP crystal 22 converges to the target temperature through the temperature control device 43. Therefore, the current commander 5 outputs the increased command value as time elapses in a duration time longer than the time required for the temperature control of the KTP crystal 22 by the temperature control device 43.

In addition, when the command value is increased in steps, and especially when the command value is increased at each step before overshooting calms down, overshooting increases greatly due to the repeated occurrences of overshooting. For this reason, the current commander 5 increases the command value in steps in a duration time longer than a product of the time required to calm down overshooting at each step with the command value and the number of steps, then brings the command value to reach the target command value. In this way, the current control device 42 can reduce overshooting of the emission power by increasing the command value in steps, in comparison with outputting a rectangular-wave-shaped command value by the conventional laser device.

In the example shown in FIG. 3, when the command value is at least 1100 mV, the emission power is reduced even though the command value is increased. This is because the laser light wavelength is converted by the laser current and excitation efficiency of the resonator is changed.

Figure 4:
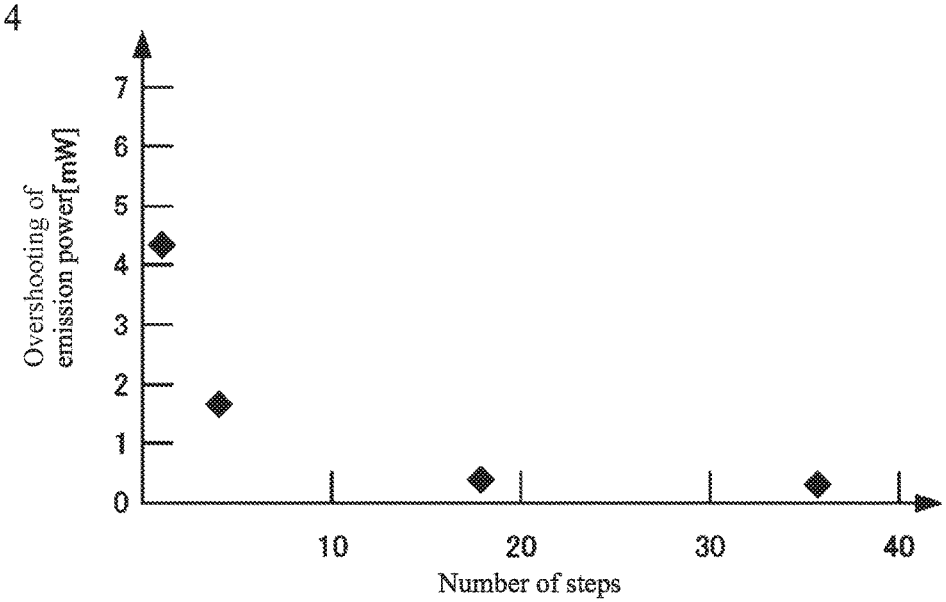
FIG. 4 illustrates a relationship between the number of steps and overshooting of the current command value.

Next, a relationship between the number of steps and overshooting of the emission power is described. FIG. 4 illustrates a relationship between the number of steps and overshooting. The vertical axis of FIG. 4 shows a maximum value of overshooting at each step. In the example shown in FIG. 4, the relationship between the number of steps and overshooting in four cases is illustrated with "♦". As shown in FIG. 4, when the number of steps is increased, overshooting is reduced.

Modification

In the above-described embodiment, the current commander 5 outputs the increased command value in steps. However, the present invention is not limited to this. The current commander 5 may output the command value that is continuously increased. For example, when the target command value is set as I1 and an arrival time as T1, the current commander 5 outputs the continuously increased command value such that the amount of increase of the command value per second stays at I1/T1. In this example, the arrival time T1 is longer than the time required for the temperature control of the KTP crystal 22 by the temperature control device 43.

FIG. 5 illustrates a relationship between the command value and the emission power of the laser light when the command value is continuously increased. As shown in FIG. 5, even when the command value is continuously increased, a rapid increase of the emission power of the laser light is suppressed and overshooting is reduced.

Figure 6A:
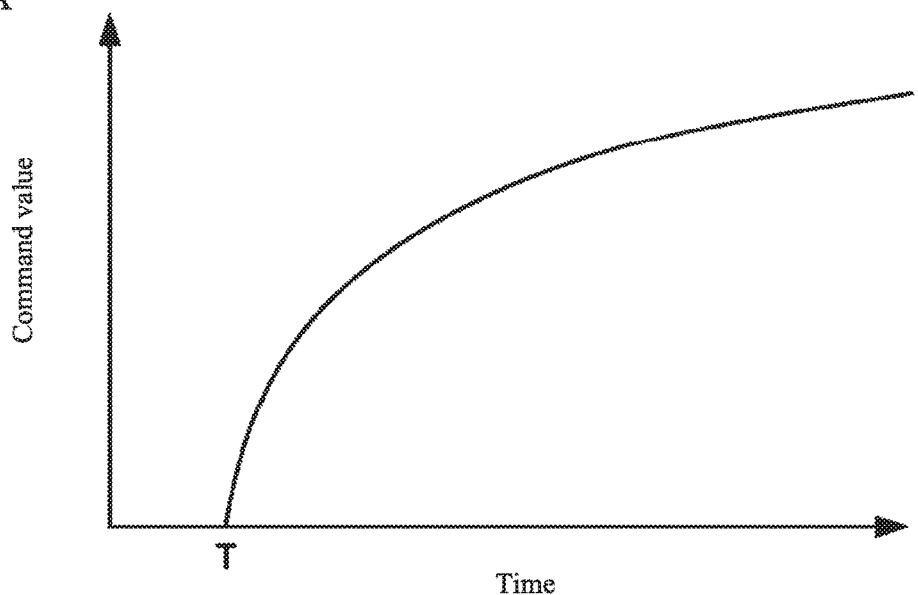
FIGS. 6A and 6B illustrate a relationship between the current command value according to another aspect and time elapsed.
Figure 6B:
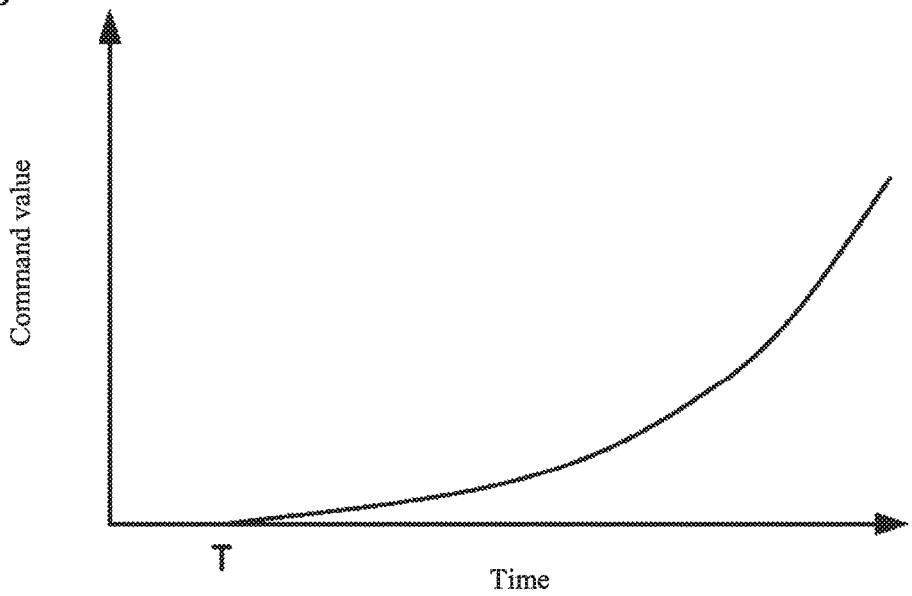
Figure 7:
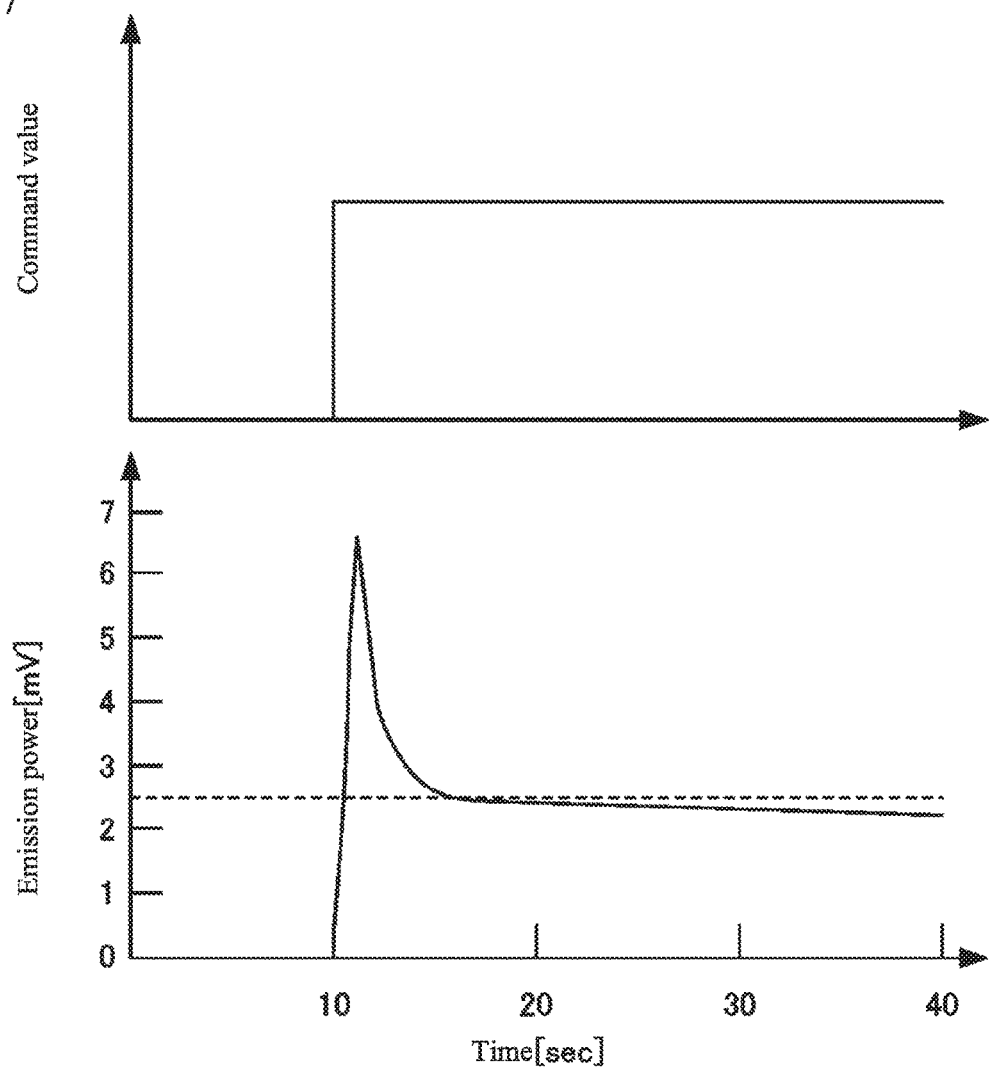
FIG. 7 illustrates a relationship between the current command value input immediately after starting a semiconductor laser and the emission power of the laser light in a conventional laser device.

Further, the current commander 5 outputs the command value with the increment of the command value kept at a certain amount. However, the present invention is not limited to this. FIG. 6 shows a relationship between the command value according to another aspect and the time elapsed. For example, the current commander 5 may reduce the increment of the command value with the lapse of time as shown in FIG. 6A, or may increase the increment of the command value with the lapse of time as shown in FIG. 6B.

In addition, the current commander 5 may change the increment of the command value based on the current value of the laser current detected by the current detection circuit 62. For example, information showing the relationship between the increment of the command value and the amount of overshooting, and information showing the relationship between the current value of the laser current and the emission power of the laser light may be stored in advance in a memory (not shown in the drawings) provided to the controller 4. With reference to the information stored in the memory, the increment of the command value increase may be changed such that the emission power of the laser light does not exceed the emission power specified beforehand. In addition, the current commander 5 monitors a state of overshooting and may perform a feedback control such that the emission power of the laser light does not exceed the emission power specified beforehand.

In addition, when the laser device 100 can select the emission power of the laser light, the current commander 5 may change the increment of the command value in accordance with the emission power selected. For example, when the emission power selected is relatively small and does not exceed the specified value even with overshooting, the current commander 5 may increase the increment of the command value and bring the emission power to reach the target value quickly. In addition, when the emission power is relatively large, the current commander 5 may reduce the increment of the command value and prevent the emission power from exceeding the specified value with overshooting.

Further, the current commander 5 may change the increment of the command value based on the surrounding temperature of the laser device 100. For example, the current commander 5 may increase the increment of the command value when the surrounding temperature of the laser device 100 is lower than the predetermined temperature and reduce the increment of the command value when the surrounding temperature is higher than the predetermined temperature.

Benefits of the Present Embodiment

As described above, the current control device 42 according to the present embodiment increases the command value corresponding to the current value of the laser current with a lapse of time until reaching the target command value corresponding to the current value of the laser current to output the laser light with the predetermined strength, and supplies the current with the size corresponding to the command value to the semiconductor laser 11. In this way, the current control device 42 can suppress overshooting of the emission power in the transient state immediately after starting the laser device 100, and therefore the emission power of the laser device 100 can be suppressed within the predetermined class.

The present invention is described by way of an embodiment, but the technical scope of the present invention is not limited to that described in the embodiment above. It is clear to one skilled in the art that many modifications or improvements might be added to the embodiment above. The scope of the claims makes clear that the addition of such modifications and improvements is also included in the technical scope of the present invention. For example, the configuration of the current control device 42 may be configured differently as long as serving the function described in the embodiment above. For example, the current commander 5 of the current control device 42 may be configured with an integrated circuit of the operational amplifier and the like, and the command value may be increased with a lapse of time. Further, the current commander 5 may be digitally controlled. Furthermore, the current commander 5 and the current driver 7 may be configured with a single element using a power operational amplifier.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A current control device that supplies a current to a semiconductor laser in order to output laser light from the semiconductor laser, the current control device comprising:
   a processor configured to output a command value corresponding to a current value by continuously increasing the command value with a lapse of time until reaching a target command value corresponding to the current value to output the laser light with a predetermined strength; and
   a circuit configured to supply a current with a size corresponding to the command value output by the processor to the semiconductor laser.

2. The current control device according to claim 1, wherein the processor is further configured to increase the command value in steps.

3. The current control device according to claim 1, wherein the processor is further configured to decrease an increment of the command value with a lapse of time.

4. The current control device according to claim 1, wherein the processor is further configured to increase the increment of the command value with a lapse of time.

5. The current control device according to claim 1, further comprising a detector configured to detect the current value, wherein the processor is further configured to change the increment of the command value based on the detected current value.

6. A laser device comprising:
   a semiconductor laser;
   a controller configured to supply a current to the semiconductor laser in order to output laser light from the semiconductor laser, the controller comprising:
      a processor configured to output a command value corresponding to a current value by increasing the command value with a lapse of time until reaching a target command value corresponding to the current value to output the laser light with a predetermined strength; and
      a circuit configured to supply a current with a size corresponding to the command value output by the processor to the semiconductor laser; and
   a nonlinear optical crystal configured to convert the laser light output from the semiconductor laser into the laser light having a different frequency from the frequency of the laser light; and
   a temperature controller configured to control a temperature of the nonlinear optical crystal, wherein, the processor is further configured to outputs the increased command value with a lapse of time in a duration of time longer than the time required by the temperature controller to control the temperature of the nonlinear optical crystal.

7. The laser device according to claim 6, wherein the processor is further configured to increase the command value in steps.

8. The laser device according to claim 6, wherein the processor is further configured to increase the command value continuously.

9. The laser device according to claim 6, wherein the processor is further configured to decrease an increment of the command value with a lapse of time.

10. The laser device according to claim 6, wherein the processor is further configured to increase the increment of the command value with a lapse of time.

11. The laser device according to claim 6, wherein:
the controller further comprises a detector configured to detect the current value, and
the processor is further configured to change the increment of the command value based on the detected current value.

* * * * *

UNITED STATES PATENT AND TRADEMARK OFFICE
CERTIFICATE OF CORRECTION

| | | |
|---|---|---|
| PATENT NO. | : 10,170,885 B2 | Page 1 of 1 |
| APPLICATION NO. | : 15/625241 | |
| DATED | : January 1, 2019 | |
| INVENTOR(S) | : Oozeki et al. | |

It is certified that error appears in the above-identified patent and that said Letters Patent is hereby corrected as shown below:

In the Claims

At Column 8, Line 48 (Claim 6, Line 21), please change "to outputs" to -- to output --

Signed and Sealed this
Twenty-fifth Day of February, 2020

Andrei Iancu
*Director of the United States Patent and Trademark Office*